(12) United States Patent
Yamagishi et al.

(10) Patent No.: US 10,109,557 B2
(45) Date of Patent: Oct. 23, 2018

(54) ELECTRONIC DEVICE HAVING SEALED HEAT-GENERATION ELEMENT

(71) Applicant: DENSO CORPORATION, Kariya, Aichi-pref. (JP)

(72) Inventors: Tetsuto Yamagishi, Kariya (JP);
Toshihiro Nagaya, Kariya (JP);
Masayuki Takenaka, Kariya (JP);
Shinji Hiramitsu, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 15/527,740

(22) PCT Filed: Dec. 11, 2015

(86) PCT No.: PCT/JP2015/006196
§ 371 (c)(1),
(2) Date: May 18, 2017

(87) PCT Pub. No.: WO2016/098332
PCT Pub. Date: Jun. 23, 2016

(65) Prior Publication Data
US 2017/0330818 A1 Nov. 16, 2017

(30) Foreign Application Priority Data

Dec. 15, 2014 (JP) ................................ 2014-253382

(51) Int. Cl.
*H01L 23/40* (2006.01)
*H01L 23/28* (2006.01)
(Continued)

(52) U.S. Cl.
CPC .............. *H01L 23/40* (2013.01); *H01L 23/28* (2013.01); *H01L 23/367* (2013.01); *H05K 1/0209* (2013.01); *H05K 2201/062* (2013.01)

(58) Field of Classification Search
None
See application file for complete search history.

(56) References Cited

U.S. PATENT DOCUMENTS

| 2006/0065421 | A1 | 3/2006 | Arai et al. | |
|---|---|---|---|---|
| 2010/0295178 | A1* | 11/2010 | Ishihara | H01L 21/6835 257/737 |

(Continued)

FOREIGN PATENT DOCUMENTS

| JP | 2000-077831 A | 3/2000 |
|---|---|---|
| JP | 4948160 B2 | 6/2012 |

(Continued)

*Primary Examiner* — Bilkis Jahan
(74) *Attorney, Agent, or Firm* — Posz Law Group, PLC (57) ABSTRACT

An electronic device includes: a resin substrate that includes insulation resin on which wiring made of conductive material is provided; a heat-generation element that is a circuit element mounted on a first surface of the resin substrate, and is operated to generate heat; and a sealing resin that is provided on the first surface, and seals the heat-generation element. An opposite surface of the sealing resin opposite to a surface of the sealing resin in contact with the first surface is thermally connected to a heat radiation member and mounted on the heat radiation member. Each of the resin substrate and the sealing resin has a bend shape convex toward the opposite surface when each of surrounding temperatures is a normal temperature and has a linear expansion coefficient for maintaining a bend shape convex toward the opposite surface when each of the surrounding temperatures is a high temperature.

8 Claims, 5 Drawing Sheets (51) Int. Cl.
  *H05K 1/02* (2006.01)
  *H01L 23/367* (2006.01)

(56) References Cited

U.S. PATENT DOCUMENTS

2013/0306991 A1* 11/2013 Terai ................ H01L 25/07
                                                257/77
2014/0077350 A1*  3/2014 Yasukawa ........ H01L 23/3107
                                                257/692

FOREIGN PATENT DOCUMENTS

| JP | 2016-063203 A | 4/2016 |
| JP | 2016-082169 A | 5/2016 |

\* cited by examiner

ELECTRONIC DEVICE HAVING SEALED HEAT-GENERATION ELEMENT

CROSS REFERENCE TO RELATED APPLICATIONS

The present application is a U.S. national stage of International Patent Application No. PCT/JP2015/006196 filed on Dec. 11, 2015 and is based on Japanese Patent Application No. 2014-253382 filed on Dec. 15, 2014, the contents of which are incorporated herein by reference.

TECHNICAL FIELD

The present disclosure relates to an electronic device that includes a circuit element mounted on a resin substrate, the circuit element being sealed with sealing resin.

BACKGROUND ART

A hybrid integrated circuit device disclosed in Patent Literature 1 is an example of a conventional electronic device. The hybrid integrated circuit device includes components such as a circuit substrate made of aluminum, a circuit element fixed to a conductive pattern provided on a surface of the circuit substrate, and sealing resin made of thermosetting resin that covers by transfer molding with exposure of at least a rear surface of the circuit substrate through the sealing resin. A thermal expansion coefficient of the sealing resin of the hybrid integrated circuit device is made smaller than a thermal expansion coefficient of the circuit substrate to prevent a bend of the circuit substrate in an after-cure step. In addition, a linear expansion coefficient of the sealing resin of the hybrid integrated circuit device is set in a range from $15 \times 10^{-6}/°$ C. to $23 \times 10^{-6}/°$ C. in a state mixed with fillers.

PRIOR ART LITERATURE

Patent Literature

Patent Literature 1: JP 2006-100752 A

SUMMARY OF INVENTION

Another electronic device, which is not a conventional technology, may be considered. According to the electronic device, a circuit substrate is configured by a resin substrate. A heat-generation element mounted on one surface of the resin substrate is sealed with sealing resin. The sealing resin side is brought into contact with a heat radiation member to radiate heat of a circuit element from the sealing resin side. According to the electronic device, however, a mold shrinkage factor of the sealing resin extremely increases when the sealing resin is configured by sealing resin having the above linear expansion coefficient. In this case, the resin substrate side may bend into a convex shape. When the resin substrate side bends in this manner, only corners of the sealing resin of the electronic device contact the heat radiation member. In this condition, a contact area between the sealing resin and the heat radiation member decreases, thereby heat radiation efficiency may lower.

It is an object of the present disclosure to provide an electronic device capable of preventing lowering of heat radiation efficiency caused by bending.

An electronic device according to an example of the present disclosure includes: a resin substrate that includes insulation resin on which wiring made of conductive material is provided; a heat-generation element that is a circuit element mounted on a first surface of the resin substrate, and is operated to generate heat; and a sealing resin that is provided on the first surface, and seals the heat-generation element. An opposite surface of the sealing resin opposite to a surface of the sealing resin in contact with the first surface is thermally connected to a heat radiation member, and the electronic device is mounted on the heat radiation member.

Each of the resin substrate and the sealing resin has a bend shape convex toward the opposite surface when each of surrounding temperatures of the resin substrate and the sealing resin is a normal temperature and has a linear expansion coefficient for maintaining a bend shape convex toward the opposite surface when each of the surrounding temperatures is a high temperature higher than the normal temperature.

The electronic device has a bend shape convex toward the opposite surface in a temperature range from the normal temperature to the high temperature.

Accordingly, it may be possible that the electronic device maintains the state of thermal connection between the opposite surface of the sealing resin and the heat radiation member while preventing a state that only corners of the sealing resin contact the heat radiation member in the temperature range from the normal temperature to the high temperature. In other words, it may be possible that the electronic device suppresses decrease in a contact area between the opposite surface and the heat radiation member in the temperature range from the normal temperature to the high temperature, thereby allowing radiation of heat generated by the heat-generation element to the heat radiation member. Accordingly, it may be possible to the electronic device suppresses lowering of heat radiation efficiency.

BRIEF DESCRIPTION OF DRAWINGS

The above and other aspects, features and advantages of the present disclosure will become more apparent from the following detailed description made with reference to the accompanying drawings. In the drawings.

DESCRIPTION OF EMBODIMENTS

Multiple modes for carrying out the disclosure are hereinafter described with reference to the drawings. In the following description of the respective modes, parts corresponding to matters described in the preceding mode are given the same reference numbers. The same explanation of these parts may be omitted in some cases. When only a part of configurations is explained in the respective modes, other parts of the corresponding configurations may be understood based on description of the corresponding parts in the preceding mode.

Figure 1:
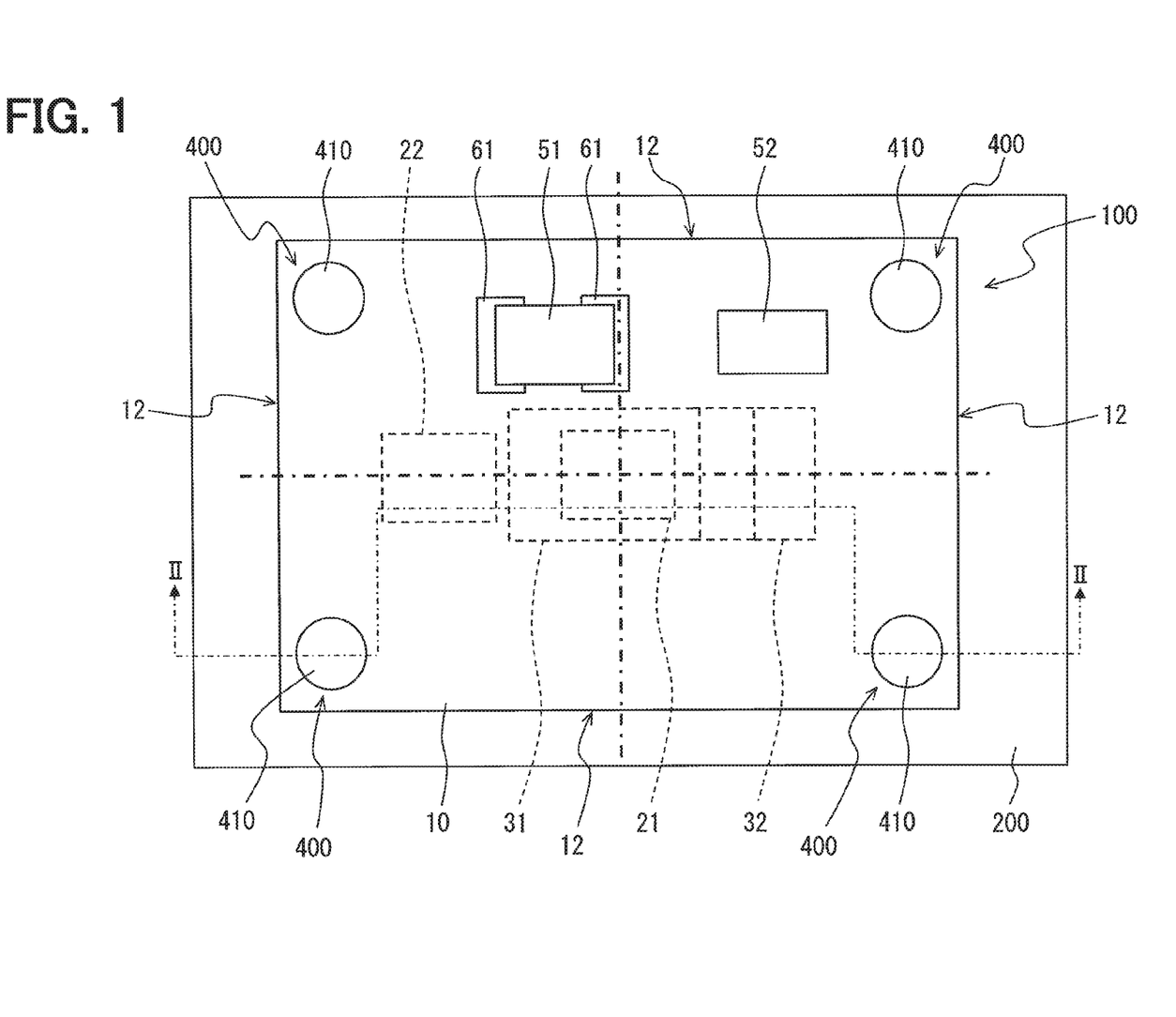
FIG. 1 is a plan view illustrating a schematic configuration of a mold package according to an embodiment.
Figure 2:
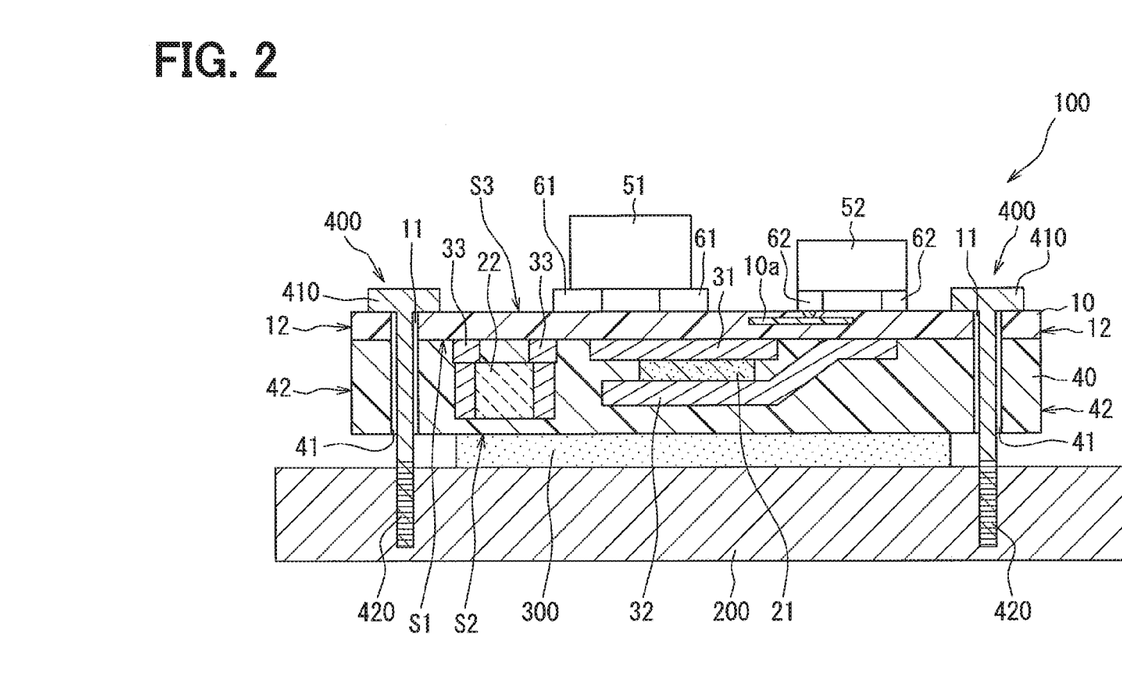
FIG. 2 is a cross-sectional view taken along a line II-II in FIG. 1.

Described in the present embodiment is a mold package 100 illustrated in FIG. 1 and other figures, presented as an example of an electronic device according to the present disclosure. As illustrated in FIG. 2, the mold package 100 includes a resin substrate 10, a heat-generation element 21 mounted on a first surface S1 of the resin substrate 10, and the mold resin 40 provided on the first surface S1 of the resin substrate 10 and sealing the heat-generation element 21. According to the present embodiment presented by way of example, the mold package 100 is applied to an in-vehicle electronic device mounted inside an engine room of a vehicle. The mold package 100 may be applied to an inverter device as an example of the in-vehicle electronic device. Alternatively, the mold package 100 may be applied to devices other than the in-vehicle electronic device. An engine room is a space where a large temperature change is generally produced in comparison with an indoor space. The mold package 100 corresponds to an example of an electronic device.

According to the mold package 100, out-mold elements 51 and 52 not sealed with the mold resin 40 may be mounted on a rear surface S3 of the resin substrate 10 on the rear side of the first surface S1 as illustrated in FIG. 1 and FIG. 2. The out-mold elements may be configured by an aluminum electrolytic capacitor 51 and a coil 52, respectively, for example. The aluminum electrolytic capacitor 51 is mounted on the rear surface S3 of the resin substrate 10 via a solder 61. Similarly, the coil 52 is mounted on the rear surface S3 of the resin substrate 10 via a solder 62. Accordingly, the mold package 100 includes the resin substrate 10 as a double-sided mounting substrate on both sides of which circuit elements are mounted. When the mold package 100 includes the resin substrate 10 configured by the double-sided mounting substrate, a size of the mold package 100 becomes smaller than a size of a structure including a single-sided mounting substrate. The size in this context refers to a size in a planar direction orthogonal to a thickness direction of the mold package 100.

However, the out-mold elements are not limited to these examples. In addition, three or more out-mold elements may be mounted on the mold package 100, or out-mold elements may be eliminated. The aluminum electrolytic capacitor 51 and the coil 52 may be mounted on the resin substrate 10 via a conductive adhesive other than the solder 61 and the solder 62.

As illustrated in FIG. 2, a chip capacitor 22 may be mounted on the first surface S1 of the resin substrate 10 of the mold package 100 via a solder 33, and sealed with the mold resin 40, in addition to the heat-generation element 21. According to the present embodiment presented by way of example, the chip capacitor 22 is configured by a ceramic capacitor. The chip capacitor 22 has a linear expansion coefficient $\alpha 3$ approximately in a range from $8 \times 10^{-6}/°$ C. to $9 \times 10^{-6}/°$ C.

A circuit element different from the chip capacitor 22 may be mounted on the mold package 100. In addition, two or more circuit elements may be mounted on the first surface S1 of the resin substrate 10 of the mold package 100 in addition to the heat-generation element 21, or only the heat-generation element 21 may be mounted on the first surface S1. A circuit element configuring a control circuit of an inverter may be further mounted on the resin substrate 10 of the mold package 100 in addition to these circuit elements.

The resin substrate 10 includes a wiring 10a made of conductive material and formed on insulation resin. The resin substrate 10 may be configured by a so-called buildup substrate including a core layer, and a buildup layer laminated on the core layer, for example. Alternatively, the resin substrate 10 may be configured by a so-called any-layer substrate on which multiple buildup layers are laminated without a core layer. The resin substrate 10 further includes lands disposed on each of the first surface S1 and the rear surface S3. The heat-generation element 21, the aluminum electrolytic capacitor 51, the coil 52 and others are mounted on the corresponding lands. The respective lands are electrically connected to the wiring 10a. Accordingly, the resin substrate 10 may be referred to as a printed board.

Moreover, the resin substrate 10 includes a solder resist on each of the first surface S1 and the rear surface S3 to prevent adhesion of the solders 31, 33, 61, and 62 to positions other than predetermined positions. Accordingly, the resin substrate 10 includes a circuit part containing the insulation resin and the wiring 10a, and the solder resist formed on each of the surfaces S1 and S3 of the circuit part. The solder resist is a known technology, and therefore is not detailed herein. The solder resist is not shown in the figures.

The resin substrate 10 has a linear expansion coefficient $\alpha 2$ approximately in a range from $13 \times 10^{-6}/°$ C. to $14 \times 10^{-6}/°$ C. More specifically, the linear expansion coefficient $\alpha 2$ corresponds to a sum of a linear expansion coefficient $\alpha 3$ of the solder resist and a linear expansion coefficient $\alpha 4$ of the circuit part. In addition, the resin substrate 10 has the anisotropic linear expansion coefficient $\alpha 2$. More specifically, the linear expansion coefficient $\alpha 2$ is an x-y synthetic expansion coefficient of the resin substrate 10, and corresponds to a linear expansion coefficient in a planar direction of the resin substrate 10. The planar direction in this context is a direction extending along a plane orthogonal to the thickness direction of the resin substrate 10.

The resin substrate 10 has a rectangular parallelepiped shape, for example. More specifically, each of the first surface S1 and the rear surface S3 of the resin substrate 10 has a rectangular shape. Four side surfaces 12 continue from the first surface S1 and the rear surface S3. The side surfaces 12 are also referred to as substrate side surfaces.

The resin substrate 10 includes a through hole 11 penetrating the resin substrate 10 in the thickness direction of the resin substrate 10. The through hole 11 corresponds to a substrate through hole according to this disclosure. The through hole 11 is a hole extending from the first surface S1 to the rear surface S3. The through hole 11 is a hole into which a screw 400 is inserted. The resin substrate 10 includes the through holes 11 at four corners of a horizontal plane of the resin substrate 10 in the thickness direction of the resin substrate 10, for example. However, the object of the present disclosure is achievable without the through holes 11. The screws 400 correspond to fixing members according to the present disclosure. As illustrated in FIG. 2, each of the screws 400 includes a screw head 410, and a screw groove portion 420 at the tip side of a portion projecting from the screw head 410.

The heat-generation element 21 is a circuit element mounted on the first surface S1 of the resin substrate 10, and operated to generate heat. The heat-generation element 21 may be configured by a metal-oxide semiconductor field-effect transistor (MOSFET), an insulated gate bipolar transistor (IGBT), or the like. When the mold package 100 is applied to an inverter device, the heat-generation element 21 corresponds to a switching element provided as a part of an inverter included in the inverter device. The heat-generation element 21 may be also referred to as a power element.

For example, the heat-generation element 21 is a semiconductor element in a bare-chip state. Electrodes are provided on both surfaces of the heat-generation element 21. The heat-generation element 21 is mounted on the resin substrate 10 via the solder 31 in a state that the mounting surface of the heat-generation element 21 faces the first surface S1 of the resin substrate 10. Accordingly, the heat-generation element 21 is mounted on the resin substrate 10 in a state that the mounting surface side electrode is electrically and mechanically connected to the solder 31. In addition, the heat-generation element 21 is mounted via the solder 31 on the land provided on the first surface S1 of the resin substrate 10. The heat-generation element 21 may be mounted on the resin substrate 10 via a conductive adhesive different from the solder 31.

The heat-generation element 21 is disposed at the center of a plane of the mold resin 40. This plane is orthogonal to a thickness of the mold resin 40 (hereinafter referred to as orthogonal plane). The orthogonal plane of the mold resin 40 is a virtual plane extending in parallel with the first surface S1 and an opposite surface S2.

Two bold alternate long and short dash lines illustrated in FIG. 1 are reference lines indicating the center of the orthogonal plane. The center of the orthogonal plane of the mold resin 40 is located at a cross position of the alternate long and short dash lines. In other words, the cross position of the alternate long and short dash lines corresponds to a center point of the orthogonal plane. This center point of the orthogonal plane is disposed so as to face a center point of the heat-generation element 21 and a center point of the first surface S1 of the resin substrate 10. In this case, the center point of the orthogonal plane, the center point of the heat-generation element 21 and the center point of the first surface S1 of the resin substrate 10 are positioned on a same axis. Accordingly, the heat-generation element 21 is mounted at the center point of the first surface S1 of the resin substrate 10.

As described above, the heat-generation element 21 is mounted on the resin substrate 10 such that a virtual line extending in the thickness direction of the heat-generation element 21 and passing through the center point of the heat-generation element 21 passes through the center point of the orthogonal plane. In this case, the heat-generation element 21 of the mold package 100 is disposed such that the virtual line passes through the center point of the opposite surface S2. According to this disclosure, it is considered that the center point of the heat-generation element 21 and the center point of the orthogonal plane are located on the same axis even in a state of slight deviation between the center point of the heat-generation element 21 and the center point of the orthogonal plane caused as a result of an error produced when the heat-generation element 21 is mounted on the resin substrate 10.

The present disclosure is not limited to this configuration. More specifically, the heat-generation element 21 is not required to be disposed in such a position that the center point of the heat-generation element 21 and the center point of the orthogonal plane are located on the same axis. In addition, the center of the orthogonal plane may be considered not as a center point as described above, but as an area containing a center point. Accordingly, the heat-generation element 21 may be mounted within an area containing the center point of the orthogonal plane in a state of non-alignment between the center point of the heat-generation element 21 and the center point of the orthogonal plane.

Accordingly, multiple heat-generation elements 21 may be mounted around the center point of the first surface S1 of the resin substrate 10. In other words, the mold package 100 may include the heat-generation elements 21 disposed around the center point of the first surface S1.

The heat-generation element 21 further includes a clip 32 mechanically and electrically connected to a non-mounting surface corresponding to the opposite surface of the mounting surface of the resin substrate 10. The clip 32 is a member containing metal such as copper as a main component. The clip 32 is a member which includes an element side portion facing the non-mounting surface of the heat-generation element 21, a substrate side portion facing the first surface S1 of the resin substrate 10, and a connection portion connecting the element side portion and the substrate side portion. The element side portion, the substrate side portion, and the connection portion of the clip 32 are formed integrally with each other. The element side portion of the clip 32 is electrically and mechanically connected to a non-mounting surface side electrode of the heat-generation element 21, while the substrate side portion of the clip 32 is electrically and mechanically connected to the land of the resin substrate 10. For example, the clip 32 is electrically and mechanically connected to the heat-generation element 21 and the resin substrate 10 via conductive connection members such as solder.

The clip 32 functions as a terminal for electrically connecting the heat-generation element 21 and the resin substrate 10, and as a heat sink for radiating heat generated from the heat-generation element 21. As described above, the clip 32 is electrically and mechanically connected to the non-mounting surface of the heat-generation element 21. In this case, heat generated from the heat-generation element 21 is transmitted from the non-mounting surface of the heat-generation element 21 to the element side portion of the clip 32. Accordingly, the clip 32 is mounted such that heat generated from the heat-generation element 21 is easily radiated from the non-mounting surface side.

The clip 32 is electrically and mechanically connected to the non-mounting surface side electrode of the heat-generation element 21 in a state that the element side portion of the clip 32 faces an entire area of the non-mounting surface of the heat-generation element 21. This structure can improve heat radiation efficiency of the clip 32 in comparison with a structure which includes the element side portion facing only a part of the non-mounting surface. However, the clip 32 may be electrically and mechanically connected to the non-mounting surface side electrode in a state that the element side portion faces only a part of the non-mounting surface. In addition, the object of the present disclosure is achievable even without the clip 32.

The mold resin 40 is made of resin, such as epoxy resin, containing fillers such as $AL_2O_3$. The mold resin 40 corresponds to sealing resin according to the present disclosure. A linear expansion coefficient $\alpha 1$ of the mold resin 40 is controllable by adjusting a ratio of resin to fillers. The mold resin 40 has the isotropic linear expansion coefficient $\alpha 1$. The linear expansion coefficient $\alpha 1$ is evaluated by TMA, for example. The linear expansion coefficient $\alpha 1$ is calculated by dividing deformation by a temperature corresponding to a practical use in a range from −40° C. to 150° C. The term TMA is an abbreviation of thermomechanical analysis.

The mold resin 40 provided on the first surface S1 seals the heat-generation element 21. The mold resin 40 also integrally seals the connection portion between the heat-generation element 21 and the resin substrate 10, that is, the land and the solder 31, as well as the heat-generation element 21. The mold resin 40 also integrally seals the clip 32, and the connection portion between the clip 32 and the resin substrate 10, as well as the heat-generation element 21. The mold resin 40 according to the present embodiment integrally seals the chip capacitor 22, and the connection portion between the chip capacitor 22 and the resin substrate 10, that is, the land and the solder 33, as well as the heat-generation element 21.

The mold resin 40 further seals a circuit element 20 and the like while tightly contacting at least a part of the first surface S1 of the resin substrate 10. According to the present embodiment, the mold resin 40 is provided in tight contact with the entire area of the first surface S1 of the resin substrate 10. In other words, the entire area of the first surface S1 of the resin substrate 10 is sealed by the mold resin 40.

As described above, the mold resin 40 is also provided on the element side portion of the clip 32. In this case, the mold resin 40 is also provided on the element side portion on the side opposite to the side to which the heat-generation element 21 is connected. It may be preferable that the thickness of the mold resin 40 provided on the side opposite to the side to which the heat-generation element 21 is connected be the smallest possible thickness sufficient for securing insulation of the clip 32. This structure of the mold package 100 is advantageous from a viewpoint of efficient radiation of heat of the heat-generation element 21 from the clip 32 and the mold resin 40.

According to the mold package 100, the mold resin 40 sealing the heat-generation element 21 and the chip capacitor 22 reduces adhesion of dust or the like to these elements. Moreover, the mold package 100 that seals the connection portion between the heat-generation element 21 and the resin substrate 10, the connection portion between the chip capacitor 22 and the resin substrate 10, and like portions secures reliability of connection between the resin substrate 10 and components such as the heat-generation element 21 and the chip capacitor 22.

As described above, only the first surface S1 side of the resin substrate 10 of the mold package 100 is sealed by the mold resin 40. Accordingly, the mold package 100 is considered as a half-mold package. The mold resin 40 may be formed by compression molding or transfer molding, for example.

The mold resin 40 includes side surfaces 42 provided along the respective side surfaces 12 of the resin substrate 10. The side surfaces 42 are also referred to as resin side surfaces. Accordingly, the respective side surface 12 and the respective side surface 42 are disposed flush with each other. The mold resin 40 includes the flat opposite surface S2 on the side opposite to the surface contacting the first surface S1. Accordingly, a resin structure configured by the resin substrate 10 and the mold resin 40 formed on the resin substrate 10 form a rectangular parallelepiped shape.

The mold resin 40 includes through holes 41 formed at positions facing the through holes 11 of the resin substrate 10. The through holes 41 penetrate in the thickness direction of the mold resin 40. The through holes 41 correspond to resin through holes according to this disclosure. The through holes 41 communicate with the through holes 11. Accordingly, the resin structure includes the through holes 11 and 41 penetrating from the rear surface S3 to the opposite surface 52. However, the object of the present disclosure is achievable even without the through holes 41.

As illustrated in FIG. 2, the mold package 100 having this structure is mounted on a metal base 200 via a heat radiation gel 300. More specifically, the mold package 100 is mounted on the metal base 200 in a state that the opposite surface S2 of the mold resin 40 is thermally connected to the metal base 200. In addition, the mold package 100 is fixed to the metal base 200 via the screws 400 inserted through the through holes 11 and 41 with the screw groove portions 420 fastened to screw holes of the metal base 200. The mold package 100 is therefore screwed to the metal base 200 via the screws 400. In other words, the mold package 100 is fixed to the metal base 200 by fastening the screw 400.

The mold package 100 is fixed to the metal base 200 via the screws 400 inserted into the through holes 11 and 41 provided at the four corners. This structure prevents separation of the mold package 100 from the metal base 200 as a result of vibration, for example. Similarly, this structure prevents rising of the opposite surface S2 of the mold package 100 from the metal base 200. Intensive vibration or continuous vibration of a vehicle may be caused depending on road conditions while a vehicle is traveling. However, this structure prevents separation of the mold package 100 from the metal base 200, or rising of the opposite surface S2 from the metal base 200 even in these situations. Accordingly, this structure prevents lowering of heat radiation efficiency as a result of separation of the mold package 100 from the metal base 200. In other words, this structure prevents lowering of heat radiation efficiency by suppressing decrease in the contact area between the mold package 100 and the metal base 200 as a result of vibration or the like.

According to the present embodiment, the mold package 100 is fixed to the metal base 200 via the four screws 400 as illustrated in FIG. 1. However, fixation to the metal base 200 according to the present disclosure may be achieved by fixing members other than the screws 400. For example, the mold package 100 may be fixed to the metal base 200 by fixing members between which the mold package 100 and the metal base 200 are sandwiched with spring force applied to the mold package 100 and the metal base 200.

The metal base 200 corresponds to a heat radiation member according to the present disclosure. The metal base 200 is a member containing metal such as aluminum and copper as a main component. The metal base 200 is a part of a housing storing the mold package 100, a part of a carrying device carrying the mold package 100, or others. Examples of the carrying device include a traveling motor for a vehicle, and an engine. The metal base 200 is a part on which the mold package 100 is mounted, and therefore may be referred to as a mounted device.

The heat radiation gel 300 is a gelatinous heat radiation member, and corresponds to a heat conductive member according to the present disclosure. As illustrated in FIG. 2, the opposite surface S2 of the mold resin 40 is thermally connected to the metal base 200 via the heat radiation gel 300. In other words, the heat radiation gel 300 is provided in contact with the metal base 200. In addition, the opposite surface S2 of the mold resin 40 of the mold package 100 contacts the heat radiation gel 300. The mold package 100 is fixed to the metal base 200 via the heat radiation gel 300, and a contact area between the mold package 100 and the metal base 200 increases in comparison with a structure not including the heat radiation gel 300. Similarly, thermal resistance between the mold package 100 and the metal base 200 decreases in comparison with the structure not including the heat radiation gel 300. Accordingly, heat radiation efficiency of the mold package 100 improves in comparison with the structure not including the heat radiation gel 300. According to the present disclosure, heat radiation grease containing silicone as a main component may be employed in place of the heat radiation gel 300.

A manufacturing method of the mold package 100 is hereinafter described. In a first step initially performed, the heat-generation element 21 is mounted via the solder 31 on the first surface S1 of the resin substrate 10, on which surface S1 the wiring 10a and the land have been formed. In other words, the heat-generation element 21 is mounted via the solder 31 on the land provided on the first surface S1 in the first step. The heat-generation element 21 is mounted on the resin substrate 10 by reflow soldering or other methods in the first step. The chip capacitor 22 may be mounted on the resin substrate 10 together with the heat-generation element 21 in a first step.

In a second step performed after the first step, the clip 32 is mounted on the resin substrate 10 on which the heat-generation element 21 has been mounted. In the second step, mechanical and electrical connection between the heat-generation element 21 and the element side portion of the clip 32, and mechanical and electrical connection between the land of the resin substrate 10 and the substrate side portion of the clip 32 are made via soldering. The first step and the second step may be simultaneously performed. The aluminum electrolytic capacitor 51 and the coil 52 are connected to the rear surface S3 of the resin substrate 10 by reflow soldering after the second step and before a third step.

In the third step performed after the second step, the mold resin 40 is formed by compression molding on a structure manufactured by the second step. In the third step, each of the through holes 11 is closed by a pin or the like so as to prevent closure of the through holes 11 by resin material during compression molding. This method allow formation of the through holes 41 communicating with the through holes 11 in the mold resin 40 in the third step.

According to the present disclosure, a package structure containing multiple integrated mold packages 100 may be diced into separate pieces of the mold packages 100. In this case, a base substrate containing the multiple integrated resin substrates 10 is prepared in the first step. Then, the heat-generation element 21 and the like are mounted on each of substrate areas of the base substrate as areas to become the respective resin substrates 10 in the first step. In the second step, each of the clips 32 is mechanically and electrically connected to the corresponding one of the heat-generation elements 21 and the substrate areas.

In the subsequent third step, the mold resin 40 is integrally formed by compression molding on the base substrate on which the heat-generation elements 21, the dips 32 and the like are mounted for the corresponding substrate areas. Accordingly, the mold resin 40 is integrally formed on the respective substrate areas in the third step. A mold package structure is thus manufactured in the third step. In a subsequent fourth step, the mold package structure is diced. The package structure is thus divided into the multiple mold packages 100 in the fourth step. This manufacturing method facilitates manufacture of the mold package 100 including the mold resin 40 formed on the entire area of the first surface S1 of the resin substrate 10.

Figure 3:
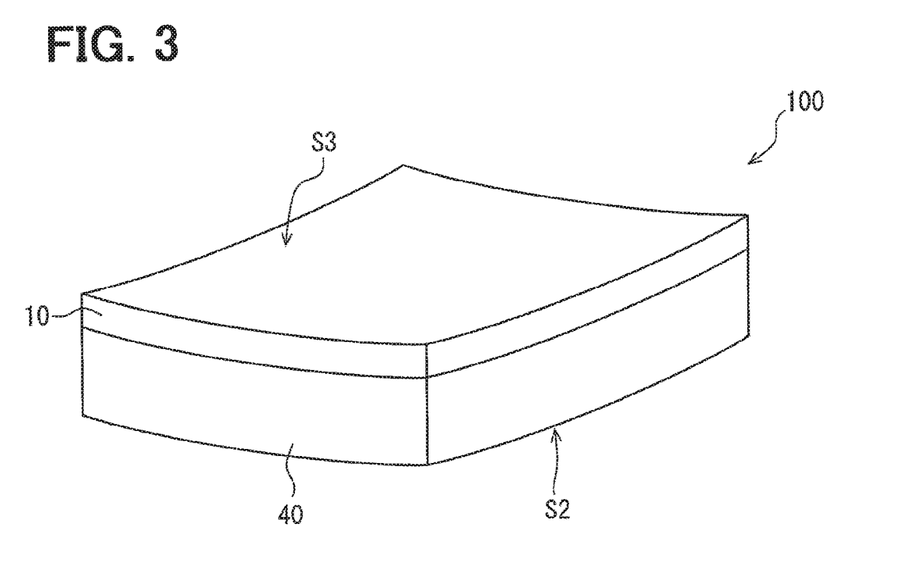
FIG. 3 is a perspective view illustrating a bend state of the mold package according to the embodiment.

The mold package 100 may bend in some cases in accordance with a difference between the linear expansion coefficient al of the mold resin 40 and the linear expansion coefficient $\alpha 2$ of the resin substrate 10. The bend shape of the mold package 100 includes a cry bend corresponding to a bend shape convex toward the opposite surface S2, and a smile bend corresponding to a bend shape convex toward the rear surface S3. More specifically, in a cry bend state of the mold package 100, a central portion of the opposite surface S2 of the mold resin 40 is projected with respect to an edge portion of the opposite surface S2, while a central portion of the rear surface S3 of the resin substrate 10 is recessed with respect to the edge portion of the rear surface S3, as illustrated in FIG. 3. On the other hand, in a state of the smile bend of the mold package 100, the central portion of the rear surface S3 of the resin substrate 10 is projected with respect to the edge portion of the rear surface S3, while the central portion of the opposite surface S2 of the mold resin 40 is recessed with respect to the edge portion of the opposite surface S2. FIG. 3 is a view schematically illustrating the mold package 100, and does not show components such as the screws 400 and the heat-generation element 21.

Figure 4:
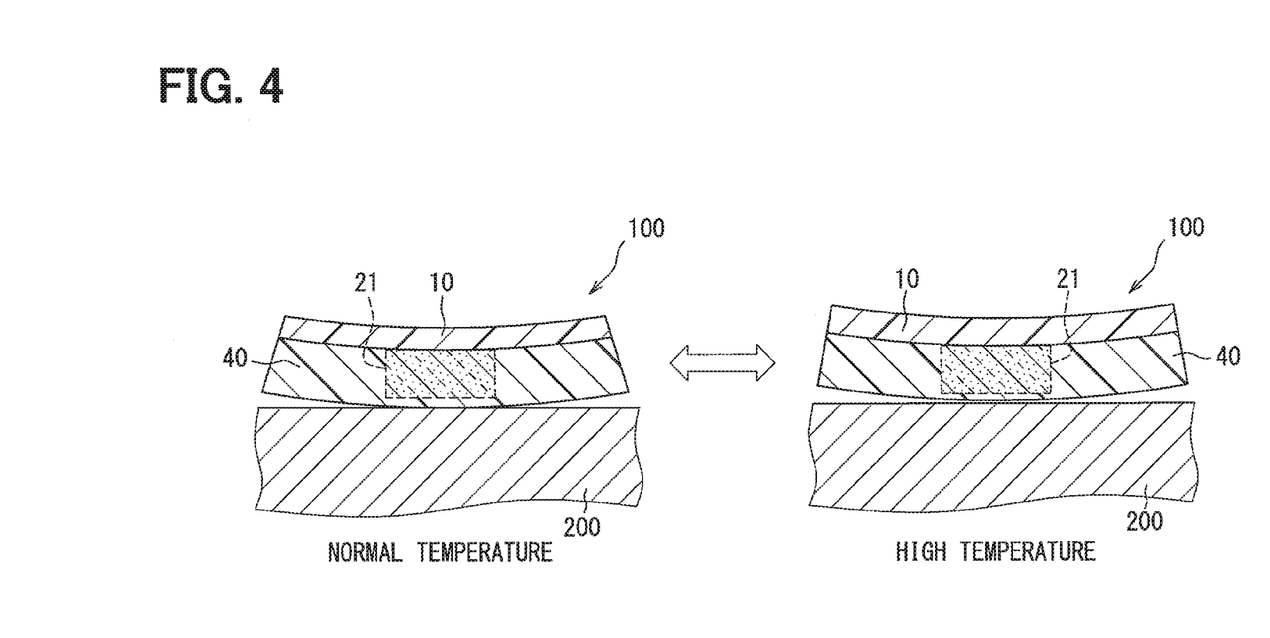
FIG. 4 is a cross-sectional view illustrating a bend state of the mold package at a normal temperature and a bend state of the mold package at a high temperature according to the embodiment.

However, the mold package 100 is capable of maintaining the cry bend when a surrounding temperature of the mold package 100 is a normal temperature. The mold package 100 is also capable of maintaining the cry bend when the surrounding temperature is a high temperature higher than the normal temperature. Accordingly, the mold package 100 is kept in the cry bend state even with a change of a bend amount in a temperature range from the normal temperature to the high temperature as illustrated in FIG. 4. FIG. 4 is a view schematically illustrating the mold package 100, and does not show components such as the screws 400, the aluminum electrolytic capacitor 51, and the heat radiation gel 300. In the following description, the temperature range from the normal temperature to the high temperature is also referred to as a first temperature range.

Figure 6:
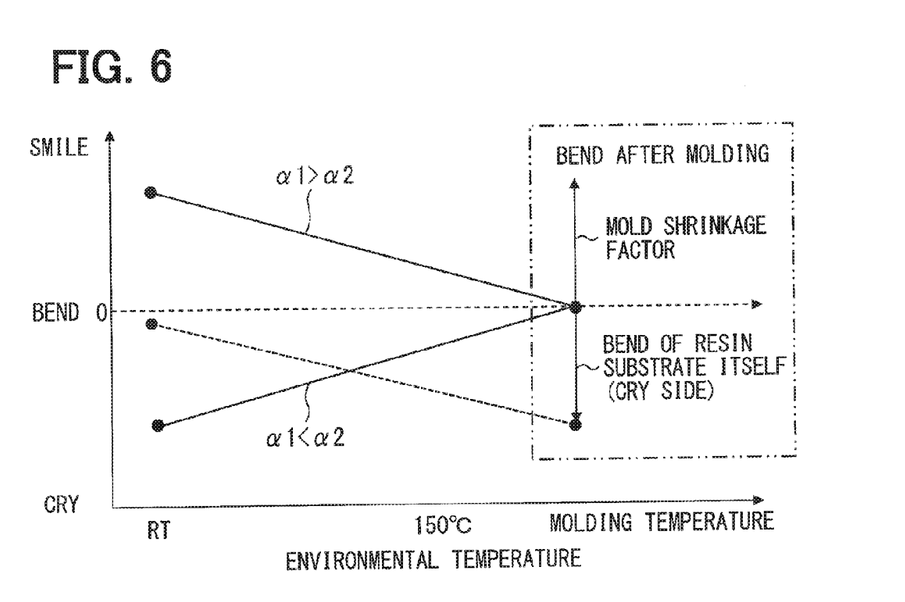
FIG. 6 is a drawing illustrating a graph showing conditions required for forming a cry bend of the mold package.

A condition for maintaining a cry bend of the mold package 100 in the first temperature range is hereinafter described. The condition for maintaining a cry bend of the mold package 100 in the first temperature range is that a bend on the cry side is retained in a relationship between a bend after molding and the linear expansion coefficients al and $\alpha 2$ as illustrated in FIG. 6. The bend after molding is determined by a molding shrinkage factor of the mold resin 40 and a residual bend of the single resin substrate 10 (cry side bend of single resin substrate). The bend after molding in this context is an initial bend after molding. An environmental temperature at an initial stage after molding is approximately 175° C., for example.

More specifically, the mold package 100 produces a cry bend when following relationships hold in the relation of the linear expansion coefficient $\alpha 2$ and the linear expansion coefficient $\alpha 1$. A first condition is that the circuit part and the solder resist are configured to produce a cry bend in the first temperature range as a result of a bend of the single resin substrate 10. In other words, the resin substrate 10 exhibits a relation (linear expansion coefficient $\alpha 3$)>(linear expansion coefficient $\alpha 4$). A second condition is that a relation (linear expansion coefficient $\alpha 2$)>(linear expansion coefficient $\alpha 1$) holds. A third condition is that a relation (bending stress caused by setting shrinkage of mold resin 40)< (bending stress caused by configuration of resin substrate 10) holds.

In addition, the mold package 100 constantly produces a cry bend in the first temperature range when a first factor and a second factor described below exhibit a relation (first factor)>(second factor) under the first through the third conditions. The first factor is a factor for bending on the cry side, and corresponds to bending moment of the resin substrate 10 and a difference in the first temperature range. The second factor is a factor for bending on the smile side, and corresponds to bending moment caused by setting shrinkage of the mold resin 40. The a difference is calculated by (linear expansion coefficient $\alpha 1$-linear expansion coefficient $\alpha 2$).

The surrounding temperature is an environmental temperature in a mounting environment where the mold package 100 is mounted. According to the present embodiment, a temperature inside an engine room corresponds to the surrounding temperature. The normal temperature is a temperature in a normal condition, and may be also referred to as RT. The term RT is an abbreviation of room temperature. In other words, the normal temperature is a temperature when a driving source of the vehicle such as an engine and a traveling motor is not operating.

On the other hand, the high temperature is a temperature when the driving source of the vehicle such as an engine and a traveling motor is operating, and lies in a range from 150° C. to 170° C., for example. The high temperature may be also referred to as a temperature when the heat-generation element 21 is operating together with the driving source.

The resin substrate 10 and the mold resin 40 of the mold package 100 have the linear expansion coefficients $\alpha 1$ and $\alpha 2$ for maintaining a cry bend in the first temperature range. More specifically, the mold package 100 exhibits a relation $|\alpha 1 - \alpha 2| < 5 \times 10^{-6}/°$ C. According to the mold package 100, separation may be caused in the interface between the resin substrate 10 and the mold resin 40 when the difference between $\alpha 1$ and $\alpha 2$ increases. However, when the resin substrate 10 and the mold resin 40 of the mold package 100 satisfy at least the relation $|\alpha 1 - \alpha 2| < 5 \times 10^{-6}/°$ C., no separation occurs in the interface between the resin substrate 10 and the mold resin 40. In this case, a cry bend is maintainable in the first temperature range. Accordingly, the mold package 100 keeps a cry bend state in the first temperature range with sufficient reliability.

According to the mold package 100 described above, the heat-generation element 21 is mounted on the first surface S1 of the resin substrate 10, and sealed with the mold resin 40. Moreover, according to the mold package 100, the mold resin 40 is mounted on the metal base 200 while thermally connected to the metal base 200. Accordingly, the mold package 100 is configured to radiate heat generated by the heat-generation element 21 from the mold resin 40 to the metal base 200. Particularly, the mold package 100 includes the resin substrate 10 configured by a double-sided mounting substrate. In this case, the heat-generation element 21 is mounted on the first surface S1 of the resin substrate 10 in a state that the first surface S1 is sealed with the mold resin 40. Accordingly, the mold package 100 easily radiates heat from the heat-generation element 21 by thermal connection between the mole resin 40 and the metal base 200.

Moreover, according to the mold package 100, the resin substrate 10 and the mold resin 40 have the linear expansion coefficients $\alpha 1$ and $\alpha 2$ producing a cry bend in the first temperature range. Accordingly, the mold package 100 maintains thermal connection between the metal base 200 and the opposite surface S2 of the mold resin 40 in the first temperature range while preventing a state that only corners of the mold resin 40 contact the metal base 200. For example, as illustrated in FIG. 4, the mold package 100 maintains a cry bend in the first temperature range even with a change of a bend amount.

In this case, the mold package 100 suppresses decrease in the contact area between the opposite surface S2 and the metal base 200 in the first temperature range, and therefore achieves radiation of heat from the heat-generation element 21 to the metal base 200. Accordingly, the mold package 100 suppresses lowering of heat radiation efficiency. In other words, the mold package 100 secures stable heat radiation in the first temperature range.

It may be preferable that a cry bend amount of the mold package 100 at the high temperature be 0 μm to 50 μm in a size of 50 mm×50 mm. This bend amount is measured in the order of a mounting step, a first measuring step, a heating step, a second measuring step, and a difference calculating step. In the mounting step, the mold package 100 not in a bending state is mounted on a flat surface. In this case, the mold package 100 is mounted in a manner that the opposite surface S2 contacts the flat surface. In the subsequent first measuring step, a height from the flat surface to the rear surface S3 of the mold package 100 is measured.

In the subsequent heating step, the surrounding temperature of the mold package 100 is raised to a high temperature in a high temperature state. In this heating step, the mold package 100 is placed in a heating furnace or the like to raise the surrounding temperature to the high temperature in the high temperature state by using the heating furnace.

In the subsequent second measuring step, a height from the flat surface to the rear surface S3 of the mold package 100 is measured. In this second measuring step, a height from the flat surface as a reference to the highest position of the rear surface S3 of the mold package 100 is measured. In the difference calculating step, a difference between the height measured in the first measuring step and the height measured in the second measuring step is calculated. The bend amount of the mold package 100 corresponds to the value of the difference calculated in this difference calculating step.

According to the mold package 100, the heat-generation element 21 is disposed at the center of the mold resin 40. As described above, the mold package 100 maintains a cry bend in the first temperature range. Accordingly, the mold package 100 suppresses decrease in the contact area between the metal base 200 and a facing area of the opposite surface S2 facing the heat-generation element 21 in the first temperature range. Accordingly, the mold package 100 efficiently radiates heat generated from the heat-generation element 21. It may be preferable that the heat-generation element 21 of the mold package 100 be disposed within a rectangular area surrounded by the screws 400 provided at the four corners for similar reasons.

The mold package 100 produces a smile bend in some cases when the surrounding temperature is a low temperature lower than the normal temperature. In the following description, a temperature range from the low temperature to the normal temperature is also referred to as a second temperature range. According to the mold package 100, however, less consideration is needed for heat radiation from the heat-generation element 21 in the second temperature range in comparison with heat radiation at the high temperature. Accordingly, the mold package 100 reduces adverse effects on the heat-generation element 21 as a result of heat both in the first temperature range and in the second temperature range Discussed hereinabove is a preferable embodiment according to the present disclosure. However, the present disclosure is not limited to the embodiment described above, but may be practiced with various modifications without departing from the scope of the present disclosure. Modified examples 1 through 3 according to the present disclosure are presented hereinbelow. Each of the embodiment described above and first to third modified examples may be practiced individually, or may be practiced in the form of an arbitrary combination of these. Combinations of the present disclosure are not limited to the combinations presented in the embodiment, but may be various different combinations.

(First Modified Example)

It may be preferable that the resin substrate 10 and the mold resin 40 of the mold package 100 have $\alpha 1$ and $\alpha 2$ for maintaining a cry bend in the first temperature range, and that α1 of the mold resin 40 be in a range of α1>10×10$^{-6}$/° C. A cry bend state of the mold package 100 is also achievable by decreasing α1. However, when the difference between α1 and α2 of the mold package 100 increases, separation may be caused in the interface between the mold resin 40 and the circuit element sealed by the mold resin 40. Particularly, a of the chip capacitor 22 is generally smaller than each of α1 and α2. In addition, the chip capacitor 22 has a size larger than the size of the heat-generation element 21. Accordingly, when the difference between α1 and α2 increases in the mold package 100, a crack may be produced in the resin substrate 10, as well as separation caused in the interface between the chip capacitor 22 and the mold resin 40. More specifically, stress concentrates on the connection portion between the resin substrate 10 and the solder 33 in the mold package 100, in which condition a crack may be produced in the resin substrate 10.

Accordingly, it may be preferable that α1 of the mold resin 40 of the mold package 100 be set to such a value capable of maintaining a cry bend in the first temperature range, and also preventing a crack in the resin substrate 10. When the mold package 100 is configured such that the resin substrate 10 and the mold resin 40 have α1 and α2 for maintaining a cry bend in the first temperature range, and that the mold resin 40 has al in a range of α1>10$^{-6}$/° C., a crack in the resin substrate 10 decreases. The mold package 100 having this configuration is capable of reducing a crack in the resin substrate 10 while maintaining a cry bend in the first temperature range. Moreover, the mold package 100 capable of reducing a crack in the resin substrate 10 also reduces disconnection of the wiring 10a provided within the resin substrate 10 as a result of a crack, in addition to the advantageous effects offered in the above embodiment. Accordingly, the mold package 100 is capable of securing electric reliability.

Figure 5:
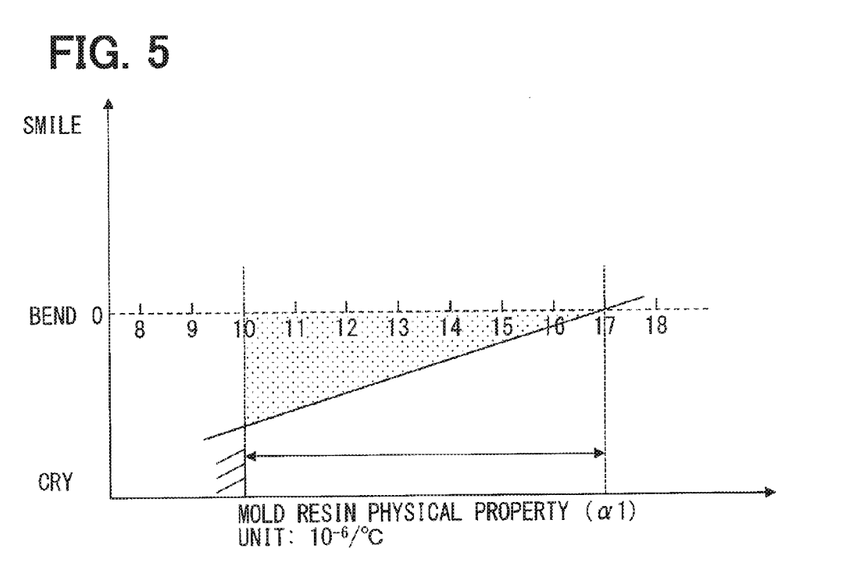
FIG. 5 is a drawing illustrating a graph showing a relationship between a bend state of the mold package and a linear expansion coefficient of a mold resin according to the embodiment.

Furthermore, in addition to the above configuration, it may be preferable that the mold package 100 include the mold resin 40 having α1 in a range of 10×10$^{-6}$/° C.<α1<17×10$^{-6}$/° C. as illustrated in FIG. 5. The heat-generation element 21 sealed with the mold resin 40 is a semiconductor element in a bare chip state. In this case, the thickness of the heat-generation element 21 is relatively small, and sufficiently smaller than the thickness of the chip capacitor 22, for example. Accordingly, when the mold package 100 includes the mold resin 40 having large α1, stress applied from the mold resin 40 to the heat-generation element 21 increases. In this case, the heat-generation element 21 may be cracked or split by the stress applied from the mold resin 40. A vertical axis in FIG. 5 represents a bend state of the mold package 100, while a horizontal axis in FIG. 5 represents the linear expansion coefficient al of the mold resin 40.

It may be preferable that the mold package 100 include the mold resin 40 having al in a range of α1<17×10$^{-6}$/° C. The mold package 100 including the mold resin 40 having al in the above range prevents application of stress from the mold resin 40 to the heat-generation element 21 at a level producing a crack in the heat-generation element 21. In this case, the mold package 100 prevents application of stress at a level producing a crack in the heat-generation element 21 in the first temperature range.

The mold package 100 is therefore capable of protecting the heat-generation element 21 from stress applied by the mold resin 40. More specifically, the mold package 100 including the mold resin 40 having the linear expansion coefficient al smaller than 17×10$^{-6}$/° C. is capable of protecting the heat-generation element 21. In this case, the mold package 100 prevents such a situation that the heat-generation element 21 does not operate in a normal condition as a result of a crack or the like. Accordingly, the mold package 100 improves electric reliability in addition to the above advantageous effects, by setting α1 and α2 to values for maintaining a cry bend in the first temperature range, and setting α1 of the mold resin 40 in a hatched range in a graph illustrated in FIG. 5. It may be preferable that the mold package 100 include the mold resin 40 having α1 in a range of 10×10$^{-6}$/° C. <α1 <15×10$^{-6}$/° C., in which range stress applied from the mold resin 40 to the heat-generation element 21 further decreases.

In addition, when the clip 32 contains copper as a main component, the linear expansion coefficient of the clip 32 becomes 17×10$^{-6}$/° C. Accordingly, separation in the interface between the mold resin 40 and the clip 32 is also suppressed when the mold resin 40 of the mold package 100 has al close to 17×10$^{-6}$/° C.

(Second Modified Example)

It may be preferable that the mold package 100 satisfy a relationship (E1+10)≤E2 between a modulus of elasticity E1 of the mold resin 40 and a modulus of elasticity E2 of the resin substrate 10, in addition to the relationship of the linear expansion coefficients described in the above embodiment. When the mold package 100 satisfies this relationship of modulus of elasticity, a cry bend is easily achieved in the first temperature range. The modulus of elasticity E1 of the mold resin 40 is approximately in a range from 10 GPa to 20 GPa. Accordingly, the modulus of elasticity E2 of the resin substrate 10 lies approximately in a range from 20 GPa to 30 GPa. The mold package 100 which includes the mold resin 40 and the resin substrate 10 having the foregoing relationship between the modulus of elasticity E1 and E2 easily produces a cry bend in the first temperature range.

The mold package 100 may be a mold package satisfying the relationship of the modulus of elasticity described in the second modified example, in addition to the relationship of the linear expansion coefficients described in the first modified example.

(Third Modified Example)

It may be preferable that the mold package 100 satisfy a condition that the thickness of the mold resin 40 is twice as large as the thickness of the resin substrate 10 or larger, in addition to the relationship of the linear expansion coefficients described in the above embodiment. When the thickness of the mold resin 40 of the mold package 100 is twice as large as the thickness of the resin substrate 10 or larger, a cry bend is easily produced in the first temperature range. For example, the mold package 100 may include the resin substrate 10 having a thickness of approximately 1 mm, and the mold resin 40 having a thickness of 2 mm or longer.

The mold package 100 may be a mold package satisfying the relationship of the thicknesses described in the third modified example in addition to the relationship of the linear expansion coefficients described in the first modified example, and the relationship of the modulus of elasticity described in the second modified example. Moreover, the mold package 100 may be a mold package satisfying the relationship of the thicknesses described in the third modified example in addition to the relationship of the linear expansion coefficients described in the first modified example. Furthermore, the mold package 100 may be a mold package satisfying the relationship of the thicknesses described in the third modified example in addition to the relationship of the modulus of elasticity described in the second modified example.

Electronic devices in various modes are provided according to the present disclosure.

An electronic device according to a mode of the present disclosure includes a resin substrate that contains insulation resin on which wiring made of conductive material is formed, a heat-generation element that is a circuit element mounted on a first surface of the resin substrate and is operated to generate heat, and sealing resin provided on the first surface and sealing the heat-generation element. According to the electronic device, an opposite surface of the sealing resin on a side opposite to a surface of the sealing resin in contact with the first surface is mounted on a heat radiation member in a state that the opposite surface is thermally connected to the heat radiation member.

Each of the resin substrate and the sealing resin has a linear expansion coefficient for maintaining a bend shape convex toward the opposite surface when each of surrounding temperatures of the resin substrate and the sealing resin is a normal temperature, and also maintaining a bend shape convex toward the opposite surface when each of the surrounding temperatures is a high temperature higher than the normal temperature.

According to the electronic device, the heat-generation element is mounted on the first surface of the resin substrate, and sealed with the sealing resin. In addition, according to the electronic device, the sealing resin is mounted on the heat radiation member in a state that the sealing resin is thermally connected to the heat radiation member. Accordingly, the electronic device radiates heat generated by the heat-generation element from the sealing resin to the heat radiation member.

According to the electronic device, the resin substrate and the sealing resin provided on the first surface have linear expansion coefficients for maintaining a bend shape convex toward the opposite surface when each of surrounding temperatures of the resin substrate and the sealing resin is a normal temperature, and also maintaining a bend shape convex toward the opposite surface when each of the surrounding temperature is a high temperature higher than the normal temperature. In this case, the electronic device forms a bend shape convex toward the opposite surface in a temperature range from the normal temperature to the high temperature.

Accordingly, the electronic device maintains the state of thermal connection between the opposite surface of the sealing resin and the heat radiation member while preventing a state that only corners of the sealing resin contact the heat radiation member in the temperature range from the normal temperature to the high temperature. More specifically, the electronic device suppresses decrease in a contact area between the opposite surface and the heat radiation member in the temperature range from the normal temperature to the high temperature, thereby allowing radiation of heat generated by the heat-generation element to the heat radiation member. Accordingly, the electronic device suppresses lowering of heat radiation efficiency.

While various embodiments, configurations, and aspects of an electronic device have been exemplified, the embodiments, configurations, and aspects of the present disclosure are not limited to those described above. For example, embodiments, configurations, and aspects obtained from an appropriate combination of technical elements disclosed in different embodiments, configurations, and aspects are also included within the scope of the embodiments, configurations, and aspects of the present disclosure.

The invention claimed is:

1. An electronic device comprising:
   a resin substrate that includes insulation resin on which wiring made of conductive material is provided;
   a heat-generation element that is a circuit element mounted on a first surface of the resin substrate, and is operated to generate heat; and
   a sealing resin that is provided on the first surface, and seals the heat-generation element, wherein:
   an opposite surface of the sealing resin opposite to a surface of the sealing resin in contact with the first surface is thermally connected to a heat radiation member and mounted on the heat radiation member;
   each of the resin substrate and the sealing resin has a bend shape convex toward the opposite surface when each of surrounding temperatures of the resin substrate and the sealing resin is a normal temperature and has a linear expansion coefficient for maintaining a bend shape convex toward the opposite surface when each of the surrounding temperatures is a high temperature; and
   the normal temperature is a temperature when the driving source of the vehicle is in a non-operation state, and the high temperature is higher than the normal temperature.

2. The electronic device according to claim 1, wherein the heat-generation element is disposed at a center of a plane orthogonal to a thickness direction of the sealing resin.

3. The electronic device according to claim 1, wherein a linear expansion coefficient $\alpha 1$ of the sealing resin and a linear expansion coefficient $\alpha 2$ of the resin substrate are expressed as $|\alpha 1 - \alpha 2| < 5 \times 10^{-6}/°$ C.

4. The electronic device according to claim 3, wherein the sealing resin has the linear expansion coefficient $\alpha 1$ in a range of $10 \times 10^{-6}/°$ C. $< \alpha 1$.

5. The electronic device according to claim 4, wherein the sealing resin has the linear expansion coefficient $\alpha 1$ in a range of $10 \times 10^{-6}/°$ C. $< \alpha 1 < 17 \times 10^{-6}/°$ C.

6. The electronic device according to claim 1, wherein the an entire area of the first surface is sealed with the sealing resin.

7. The electronic device according to claim 6, wherein:
   the resin substrate includes substrate through holes provided at four corners of a horizontal plane of the resin substrate in a thickness direction of the resin substrate, and penetrating the resin substrate in the thickness direction of the resin substrate;
   the sealing resin includes resin through holes provided at positions facing the substrate through holes, and penetrating the sealing resin in a thickness direction of the sealing resin; and
   the resin substrate and the sealing resin are fixed to the heat radiation member via fixing members inserted through the substrate through holes and the resin through holes.

8. The electronic device according to claim 1, wherein the opposite surface is thermally connected to the heat radiation member via a heat conductive member.

* * * * *